US008578879B2

(12) United States Patent
Ramaswamy et al.

(10) Patent No.: US 8,578,879 B2
(45) Date of Patent: Nov. 12, 2013

(54) APPARATUS FOR VHF IMPEDANCE MATCH TUNING

(75) Inventors: Kartik Ramaswamy, San Jose, CA (US); Hiroji Hanawa, Sunnyvale, CA (US); Kenneth S. Collins, San Jose, CA (US); Lawrence Wong, Fremont, CA (US); Samer Banna, San Jose, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 987 days.

(21) Appl. No.: 12/511,377

(22) Filed: Jul. 29, 2009

(65) Prior Publication Data

US 2011/0023780 A1 Feb. 3, 2011

(51) Int. Cl.

| | |
|---|---|
| ***C23C 16/00*** | (2006.01) |
| ***C23F 1/00*** | (2006.01) |
| ***H01L 21/306*** | (2006.01) |
| ***H01P 7/04*** | (2006.01) |
| ***H01P 7/06*** | (2006.01) |

(52) U.S. Cl.

USPC ..................... 118/723 I; 118/715; 118/723 E; 118/723 ER; 118/723 MW; 118/723 IR; 156/345.1; 156/345.41; 156/345.42; 156/345.43; 156/345.44; 156/345.47; 156/345.48; 156/345.49

(58) Field of Classification Search

USPC .................. 118/715–733; 156/345.1–345.55; 333/222–227

See application file for complete search history.

(56) References Cited

U.S. PATENT DOCUMENTS

| | | | | |
|---|---|---|---|---|
| 3,688,219 | A * | 8/1972 | Havens | 331/107 C |
| 4,292,610 | A * | 9/1981 | Makimoto et al. | 333/222 |
| 6,313,584 | B1 * | 11/2001 | Johnson et al. | 315/111.21 |
| 6,700,458 | B2 * | 3/2004 | Mitrovic et al. | 333/34 |
| 7,777,599 | B2 * | 8/2010 | Shannon et al. | 333/227 |
| 2007/0252529 | A1 | 11/2007 | Belinger | |
| 2008/0124254 | A1 | 5/2008 | Choi | |
| 2008/0179181 | A1 | 7/2008 | Collins et al. | |
| 2008/0284537 | A1 | 11/2008 | Ikenouchi | |
| 2009/0004918 | A1 * | 1/2009 | Papanide et al. | 439/620.03 |
| 2009/0257927 | A1 * | 10/2009 | Ramaswamy et al. | 422/186.29 |

OTHER PUBLICATIONS

International Search Report and Written Opinion mailed Feb. 15, 2011 for PCT Application No. PCT/US2010/042412.

* cited by examiner

*Primary Examiner* — Rakesh Dhingra
*Assistant Examiner* — Benjamin Kendall
(74) *Attorney, Agent, or Firm* — Moser Taboada; Alan Taboada

(57) ABSTRACT

Embodiments of impedance matching networks are provided herein. In some embodiments, an impedance matching network may include a coaxial resonator having an inner and an outer conductor. A tuning capacitor may be provided for variably controlling a resonance frequency of the coaxial resonator. The tuning capacitor may be formed by a first tuning electrode and a second tuning electrode and an intervening dielectric, wherein the first tuning electrode is formed by a portion of the inner conductor. A load capacitor may be provided for variably coupling energy from the inner conductor to a load. The load capacitor may be formed by the inner conductor, an adjustable load electrode, and an intervening dielectric.

26 Claims, 6 Drawing Sheets

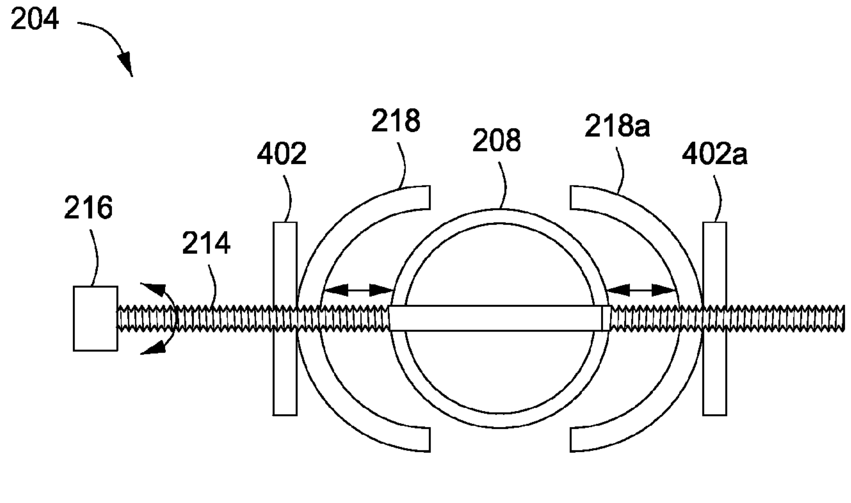
FIG. 4A
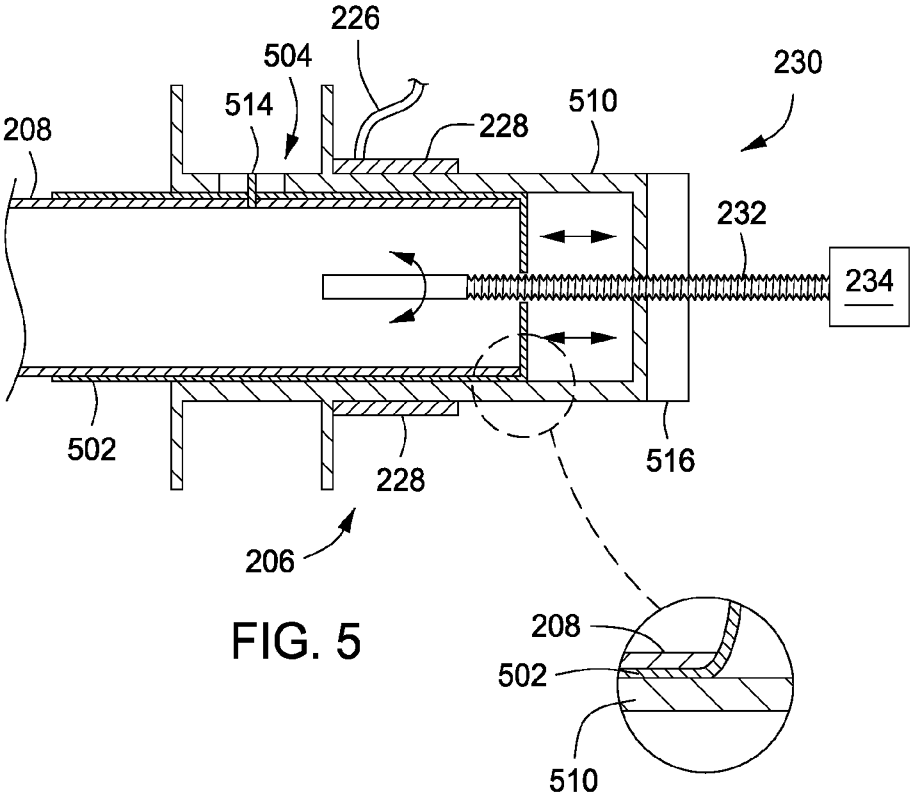
FIG. 5
FIG. 5A

APPARATUS FOR VHF IMPEDANCE MATCH TUNING

FIELD

Embodiments of the present invention generally relate to plasma enhanced process chambers and, more particularly, to impedance matching networks for processes utilizing very high frequency (VHF) power sources.

BACKGROUND

Plasma enhanced substrate process chambers are widely used in the manufacture of integrated devices. In some plasma enhanced substrate process chambers, multiple radio frequency (RF) generators are utilized to form and control the plasma. Each generator is connected to the substrate process chamber through a matching network. For processes using high frequencies (HF), matching networks commonly use lumped elements, such as commercially available capacitors.

However, for processes using VHF frequencies higher than 100 MHz, conventional lumped elements, such as capacitors, are impractical because the value of such components are not easily realizable. At these frequencies, distributed elements based on transmission lines are typically used. However, the RF transmission line is long at these frequencies and devices based on the full wavelength or quarter wavelength are, therefore, also large. In addition, these matching networks are traditionally fixed and the reflected power is absorbed in non-reciprocal devices like circulators and isolators.

Therefore, a need exists for an improved apparatus for VHF match tuning.

SUMMARY

Embodiments of impedance matching networks are provided herein. In some embodiments, an impedance matching network may include a coaxial resonator having an inner and an outer conductor. A tuning capacitor may be provided for variably controlling a resonance frequency of the coaxial resonator. The tuning capacitor may be formed by a first tuning electrode and a second tuning electrode and an intervening dielectric, wherein the first tuning electrode is formed by a portion of the inner conductor. A load capacitor may be provided for variably coupling energy from the inner conductor to a load. The load capacitor may be formed by the inner conductor, an adjustable load electrode, and an intervening dielectric.

In some embodiments, a substrate processing system may include a process chamber having a substrate support disposed therein; one or more electrodes for coupling RF power into the process chamber; and one or more RF power sources coupled to the one or more electrodes through an impedance matching network as summarized above. In some embodiments, the substrate processing system may further include one or more detectors to sense a magnitude and polarity of RF power reflected from a load during operation of the substrate processing system. A controller may be provided to vary the tuning capacitor in response to a signal corresponding to the sensed phase of the reflected RF power and to vary the load capacitor in response to a signal corresponding to the sensed magnitude of the reflected RF power.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only exemplary embodiments of this invention and are therefore not to be considered limiting of its scope, for the invention may admit to other equally effective embodiments.

FIG. 4A depicts a tuning capacitor in accordance with some embodiments of the present invention.

FIG. 5 depicts a load capacitor in accordance with some embodiments of the present invention.

Figure 1:
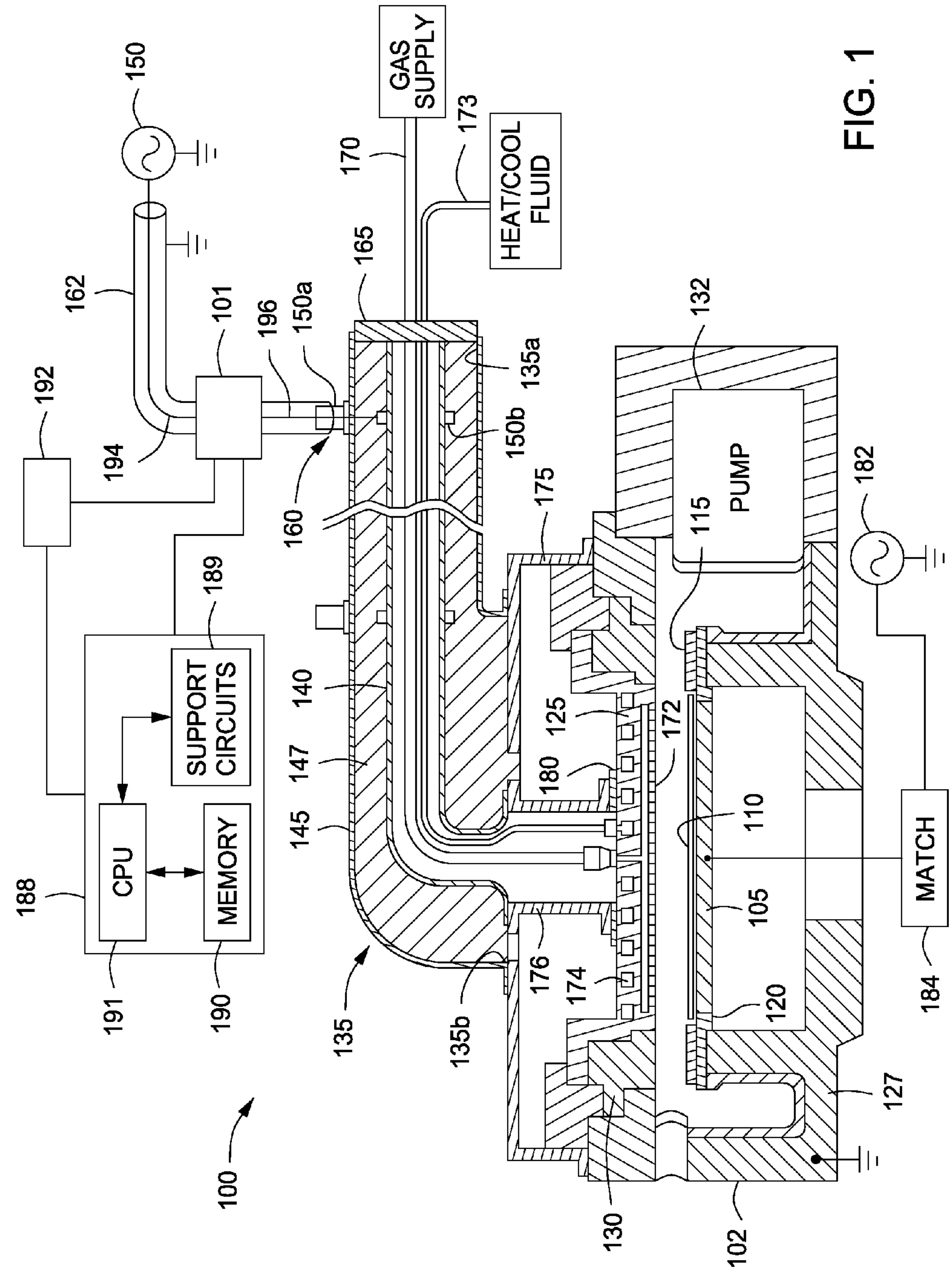
FIG. 1 depicts an illustrative system suitable for use with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to apparatus for very high frequency (VHF) impedance match tuning. As used herein, the term VHF refers to RF signals having a frequency of between about 30 to about 300 MHz. The inventive impedance matching networks may advantageously increase productivity and efficiency of plasma enhanced processing by increasing the precision and effectiveness of a match tuning network to match the output impedance of one or more power sources to the load impedance of a plasma. In some embodiments, the impedance matching networks provide a compact design that advantageously reduces the physical footprint required for the apparatus. In some embodiments, the impedance matching networks may act as a filter to lower frequencies that facilitates protection of the input signal generator.

FIG. 1 depicts an illustrative system suitable for use with some embodiments of the present invention. An exemplary processing system suitable for use with the teachings provided herein is the ENABLER® processing chamber, available from Applied Materials, Inc. of Santa Clara, Calif. Other plasma processing chambers may be modified to use the inventive impedance matching networks disclosed herein.

Referring to FIG. 1, the illustrative system 100 generally comprises a process chamber 102, having a substrate support 105 for supporting a substrate 110 to be processed disposed thereon. A semiconductor ring 115 surrounds the substrate 110. The semiconductor ring 115 is supported on the grounded chamber body 127 by a dielectric ring 120. The process chamber 102 is bounded at the top by a disc shaped overhead electrode 125 supported at a predetermined gap length above the substrate 110 on the grounded chamber body 127 by a dielectric seal 130. An RF generator 182 provides RF power through a match network 184 to the substrate support 105. A vacuum pump 132 may be coupled to the process chamber 102 to control pressure therein.

An RF generator 150 provides RF power to the overhead electrode 125 via a coaxial stub 135. The coaxial stub 135 is a fixed impedance matching network. The coaxial stub 135 has a characteristic impedance, resonance frequency, and provides an approximate impedance match between the overhead electrode 125 and the RF power generator 150. The chamber body 127 is connected to an RF return (RF ground) of the RF generator 150. The RF path from the overhead electrode 125 to RF ground is affected by the capacitance of the semiconductor ring 115, the dielectric ring 120 and the dielectric seal 130. The substrate support 105, the substrate 110 and the semiconductor ring 115 provide the primary RF return path for RF power applied to the overhead electrode 125.

The coaxial stub 135 is configured to facilitate overall system stability. It generally comprises an inner cylindrical conductor 140, an outer cylindrical conductor 145 and an insulator 147 filling the space between the inner and outer conductors 140, 145. In some embodiments, the insulator 147 has a relative dielectric constant of about 1.

The inner and outer conductors 140, 145 may be constructive of any suitable conductive material capable of withstanding the particular process environment. For example, in some embodiments, the inner and outer conductors 140, 145 may comprise nickel-coated aluminum. The radii of the inner and outer conductors 140, 145 may be varied to adjust the characteristic impedance of the coaxial stub 135. For example, in some embodiments, the outer conductor 145 has a diameter of about 4.32 inches and the inner conductor 140 has a diameter of about 1.5 inches.

In some embodiments, the axial length of the coaxial stub 135 may be varied with respect to the operational frequency of the system 100 to achieve resonance. In some embodiments, the axial length of the coaxial stub 135 may be calculated according to the full wave length (λ), half wavelength (λ/2), or quarter wave length (λ/4) of the operational frequency. For example, in embodiments where the operational frequency of the system is 162 MHz, the axial length of the of the coaxial stub 135 may be about 1.85 m (λ), 0.96 m (λ/2), or 0.46 m (λ/4). In some embodiments, for example, similar to the coaxial resonator as described below with respect to FIGS. 6A-C, the coaxial stub 135 may comprise folded inner and outer conductors 140,145, thus reducing the overall length of the coaxial stub 135.

One or more taps 160 are provided at particular points along the axial length of the coaxial stub 135 for applying RF power from the RF generator 150 to the coaxial stub 135. The RF power terminal **150*a* and the RF return terminal 150*b* of the RF generator 150 are connected at the tap 160 on the stub 135 to the inner and outer conductors 140, 145, respectively. These connections are made via the generator-to-stub coaxial cable 162 having a characteristic impedance that matches the output impedance of the generator 150 (i.e., 50Ω). A terminating conductor 165 at the far end 135*a* of the stub 135 shorts the inner and outer conductors 140, 145 together, so that the stub 135 is shorted at its far end 135*a*. At the near end 135*b* of the stub 135, the outer cylindrical conductor 145 is connected to the chamber body 127 via an annular conductive housing or support 175, while the inner conductor 140 is connected to the center of electrode 125 via a conductive cylinder or support 176. A dielectric ring 180, which in some embodiments has a thickness of about 1.3 inches and dielectric constant of about 9, is held between and separates the conductive cylinder 176 and the electrode 125**.

In some embodiments, the inner conductor 140 may provide a conduit for utilities such as process gases and coolant. This feature advantageously allows a gas line 170 and a fluid line 173 to provide gas and coolant heat transfer fluid while not having to cross large electrical potential differences. Therefore, the gas and fluid lines may be constructed of metal, a less expensive and more reliable material for such a purpose. The gas line feeds gas inlets 172 in or adjacent the overhead electrode 125 while the coolant line feeds coolant passages or jackets 174 within the overhead electrode 125.

In some embodiments, a tunable impedance matching network 101, more fully explained below with respect to FIGS. 2-5, may be coupled between the RF generator 150 and the coaxial stub 135 via a coaxial cable 162 to facilitate matching the output impedance of the RF generator 150 and a load impedance generated in the process chamber 102. An input 194 provides RF power from the RF generator 150 to the tunable impedance matching network 101 and an output 196 provides RF power from the tunable impedance matching network 101 to the coaxial stub 135. Alternatively, in some embodiments, the tunable impedance matching network may be used in process chambers without the coaxial stub 135. In such embodiments, the tunable impedance matching network may be coupled between an RF power supply and an electrode 125 to which RF power is to be coupled.

In some embodiments, the tunable impedance matching network 101 generally includes a coaxial resonator having a tunable resonance and a tunable impedance. In some embodiments, the coaxial resonator may be a folded coaxial resonator that provides a physical length that is shorter than the electrical length of the resonator. Details regarding folded coaxial resonators suitable for use in connection with embodiments of the present invention are disclosed in U.S. patent application Ser. No. 12/371,864, filed Feb. 16, 2009, by Kartik Ramaswamy, et al., entitled "Folded Coaxial Resonators," which is herein incorporated by reference in its entirety.

In some embodiments, the tunable impedance matching network 101 includes an adjustable tuning capacitor to facilitate moving the resonance peak about a central frequency. For example, for a given frequency of the RF generator (e.g., 162 MHZ in the illustrative system 100 of FIG. 1), the circuit presents either an inductive shunt element (when the generator frequency is lower than the resonance frequency) or a capacitive shunt element (when the generator frequency is higher than the resonance frequency). The tuning capacitor may include a dielectric disposed between a first electrode coupled to an RF input and a second electrode coupled to ground. The tuning capacitor may be adjustable by adjusting one or more of the dielectric value, the geometry (or relative positions) of the electrodes and the dielectric, or the like, in order to facilitate control of the tuning capacitor value.

In some embodiments, the tunable impedance matching network 101 includes an adjustable load capacitor to facilitate controlling the impedance of the tunable impedance matching network 101. The load capacitor may include a dielectric disposed between a first electrode coupled to an RF input and a second electrode coupled to an RF output. The load capacitor may be adjustable by adjusting one or more of the dielectric value, the geometry (or relative positions) of the electrodes and the dielectric, or the like, in order to facilitate control of the load capacitor value.

Figure 2:
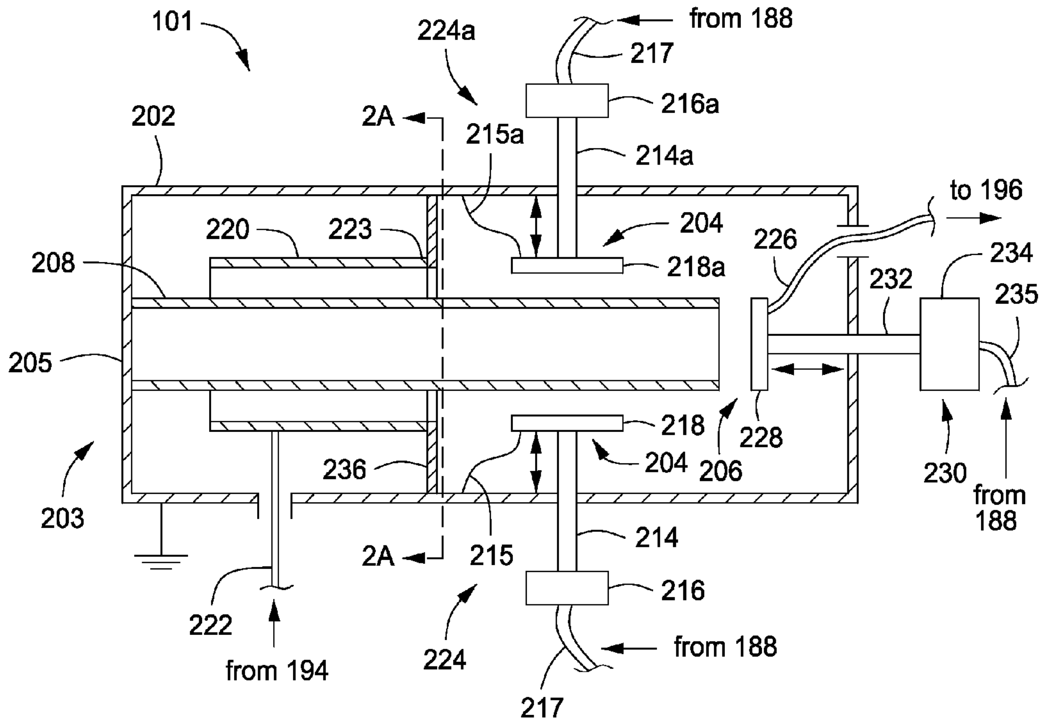
FIGS. 2-4 depict various configurations of a tunable impedance matching network in accordance with some embodiments of the present invention.
Figure 2A:
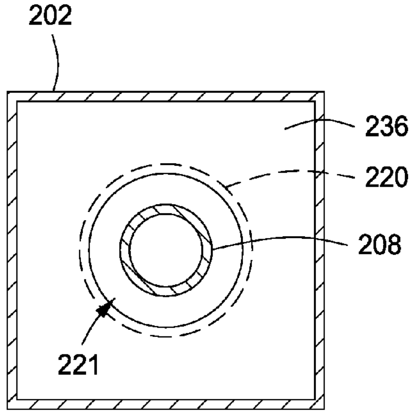

For example, FIG. 2 depicts a cross sectional top view of a tunable impedance matching network 101 in accordance with some embodiments of the present invention. FIG. 2A depicts a cross sectional view from the perspective of line "a" of the tunable impedance matching network 101 shown in FIG. 2. The embodiments depicted in FIGS. 2-2A, as well as the embodiments depicted below with respect to FIGS. 3-6C, are illustrative only and variations and combinations of these embodiments specifically contemplated in accordance with the teachings provided herein. For example, different geometries of the folded coaxial resonator, different configurations of the tuning capacitor, and/or different configurations of the load capacitor may be utilized.

In some embodiments, the tunable impedance matching network 101 depicted in FIG. 2 may generally include a coaxial resonator 203, a tuning capacitor 204 for controlling a resonance frequency of the coaxial resonator 203, and a load capacitor 206 for coupling energy from the coaxial resonator 203 to an output 196.

In some embodiments, an inner conductor 208 and an outer conductor 220 form the coaxial resonator 203. The inner and outer conductors 208, 220 may be any shape suitable to form a coaxial structure. For example, the inner and outer conductors 208, 220 may be cylindrical, ellipsoid, square, rectangular, or the like. In the embodiment depicted in FIG. 2, the inner and outer conductors are cylindrical. A grounded conductive enclosure 202 surrounds the inner conductor 208 and outer conductor 220. The conductive enclosure 202 may be of any shape suitable to support the components of the coaxial resonator 203. For example, the conductive enclosure 202 may be a cube, rectangular prism, cylinder, or the like. The inner conductor 220, outer conductor 220, and conductive enclosure 202 may be fabricated from any suitable conductive materials, such as a metal. In some non-limiting embodiments, the inner conductor 220, outer conductor 220, and conductive enclosure 202 may be fabricated from aluminum (Al).

In some embodiments, the coaxial resonator 202 may be of linear design. That is, the inner conductor 208 and outer conductor 220 are formed in a substantially straight configuration. Alternatively, in some embodiments, such as depicted in FIG. 2, and described more fully below with respect to FIGS. 6A-C, the coaxial resonator 202 may be a folded design. That is, the inner conductor 208 and outer conductor 220 are formed such a way that the respective conductors are folded, thereby providing for a coaxial resonator 203 with an overall shorter physical length while having a longer electrical length.

In some embodiments, the inner conductor 208 may be cantilevered proximate the center of the conductive enclosure 202, via coupling of one end of the inner conductor 208 to an end wall 205 of the conductive enclosure 202. A conductive plate 236 having dimensions substantially the same as the inner cross sectional dimensions of the conductive enclosure 202 is disposed in the interior of the conductive enclosure 202 and coupled to the walls of the conductive enclosure 202. The outer conductor 220 is cantilevered proximate the center of the conductive enclosure 202 via coupling of one end 223 of the outer conductor 220 to the plate 236. The outer conductor 220 is positioned such that it substantially coaxially surrounds at least a portion of the inner conductor 208. A conductor 222 is coupled to the outer conductor 220 and connected to an input 194 for providing RF power from an RF source (e.g., RF generator 150 depicted in FIG. 1). The position of the input connection facilitates controlling the impedance of the tunable impedance matching network 101. In some embodiments, once the position of the input 194 is chosen the location may be fixed. Alternatively, in some embodiments, the position of the input may be varied to facilitate and providing increased operating range.

As shown in FIG. 2A, the plate 236 has a through hole 221 proximate the center of the plate 236, wherein the through hole 221 has a size substantial enough to allow the inner conductor 208 to pass through without making contact with the plate 236. In some embodiments, the hole has a diameter that is substantially the same as the inner diameter of the outer conductor 220.

Referring again to FIG. 2, in some embodiments, the tuning capacitor 204 may be formed by the inner conductor 208, adjustable electrodes 218, 218A (collectively 218) and an intervening dielectric material. The adjustable electrodes 218 are fabricated from any suitable conductive material, for example, a metal. In some non-limiting embodiments, the adjustable electrodes 218 may be fabricated from copper (Cu), or alloys thereof, such as copper (Cu)-beryllium (Be) alloys, or the like. In some embodiments, the adjustable electrodes 218 may be shaped to interface with an outer surface of the inner conductor 208 (see, for example, FIG. 4A). In some embodiments, the adjustable electrodes 218 may configured such that, in a fully closed position, the adjustable electrodes 218 do not contact the inner conductor 208. Alternatively or in combination, in some embodiments, a dielectric layer, or coating (not shown), may be provided over at least one of the outer surface of the inner conductor 208 or the facing surface of the adjustable electrodes 218 to prevent electrical contact therebetween. The adjustable electrodes 218 may be sized or configured such that, in a fully closed position, the adjustable electrodes 218 do not contact each other.

In some embodiments, such as shown in FIG. 2, the intervening dielectric may be air. Alternatively or in combination, in some embodiments, the intervening dielectric may be a solid dielectric material disposed between the capacitor electrodes (e.g., 208 and 218) and/or on one or more of an outer surface of the inner conductor 208 or a facing surface of the adjustable tuning electrodes 218. The dielectric material may comprise any suitable, process compatible dielectric material, including polymers, or fluoropolymers, such as polytetrafluoroethylene (PTFE) (for example, Teflon®), polystyrene (for example, Rexolite®), or the like.

Flexible conductors 215, 215A provide a connection from the adjustable electrodes 218 to ground. In some embodiments, the flexible conductors 215, 215A may be coupled to the grounded conductive enclosure 202. The flexible conductors may be fabricated from any suitable flexible material. In some embodiments, the flexible conductors 215, 215A may be a flexible metal braided wire.

In some embodiments, the adjustable dielectric of the tuning capacitor 204 may be controlled via control of the adjustable electrodes 218 (e.g., by defining the dielectric gap between the electrodes 218 and the inner conductor 208). For example, as depicted in FIG. 2, a distance between the adjustable electrodes 218 and the inner conductor 208 may be controlled by a one or more position control mechanisms 224, 224A. The position control mechanisms 224, 224A may comprise of one or more shafts 214, 214A each respectively coupled to an actuator 216, 216A. The actuators 216, 216A may be controlled manually, or controlled via a signal from a controller (such as the controller 188 depicted in FIG. 1) coupled to the actuators 216, 216A via a line 217. In some embodiments, one or more supports and/or guides may be provided to constrain the movement of the adjustable electrodes 218 along a desired path (e.g., to provide linear motion and/or to prevent rotation, bending, flexing, and the like, of the adjustable electrodes 218).

The shafts 214, 214A may comprise any rigid material capable of providing adequate support to the adjustable electrodes 218. In some embodiments, the shafts 214, 214A comprise a metal, such as copper (Cu). Alternatively, in some embodiments, the shafts 214, 214A may comprise a polymeric material, such as polyoxymethylene (POM), polyetheretherketone (PEEK), polyetherimide (PEI) (for example, Ultem®), or the like.

The actuator 216, 216A may be any suitable actuator capable of accurately controlling the position of the adjustable electrodes 218. For example, the actuator 216, 216A may be a pneumatic, hydraulic, electric, or other suitable actuator. The actuators 216, 216A may control the respective positions of the electrodes 218 in any suitable manner, such as by linear movement of the shafts 214, 214A, or by rotation of the shafts 214, 214A in combination with provision of mating threaded portions on the shafts 214, 214A and the electrodes 218. In some embodiments, the actuators 216, 216A are electric rotary actuators, such as servo motors or stepper motors.

In operation, the tuning capacitor 204 allows the adjustment of a resonance peak of the coaxial resonator 203 about a central frequency of a RF power supplied to the coaxial resonator 203. For example, as the adjustable tuning electrodes 218, 218A are moved closer to the inner conductor 208 the resonance peak of the coaxial resonator 203 may be lowered. As the adjustable tuning electrodes 218, 218A are moved further away from the inner conductor 208 the resonance peak of the coaxial resonator 203 may be increased.

Figure 3:
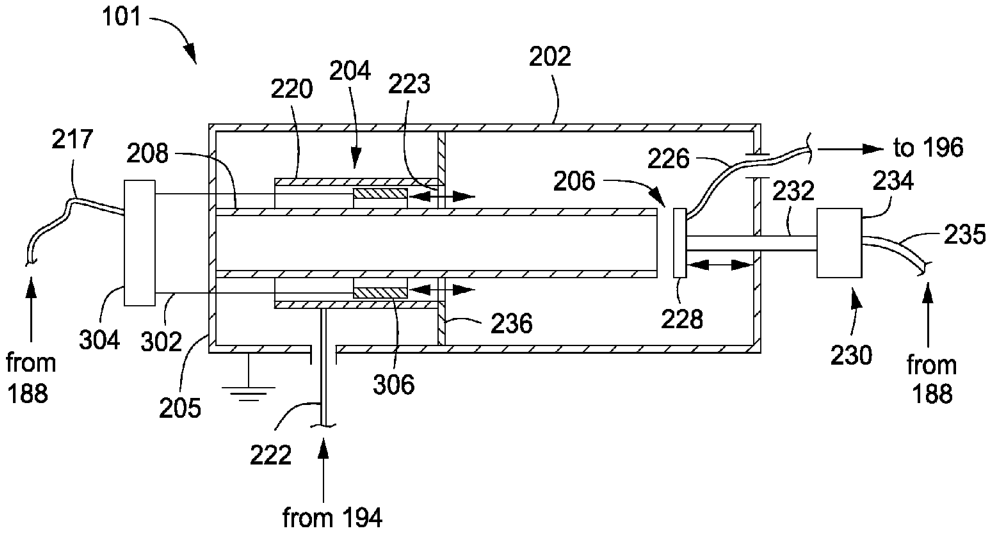

In some embodiments, such as depicted in FIG. 3, the tuning capacitor 204 may alternatively comprise a dielectric tube 306 disposed between the inner conductor 208 and outer conductor 220 and movably positionable such that the amount of overlap between the dielectric tube 306 and the inner and outer conductors 208, 220 can be controlled. The amount of overlap between the dielectric tube 306 and the inner and outer conductors 208, 220 controls the total dielectric constant of the dielectric space between the inner and outer conductors 208, 220. The dielectric tube 306 may have any suitable length for providing a desired range of the total dielectric constant of the dielectric space between the inner and outer conductors 208, 220. In some embodiments, the dielectric tube 306 may have a length of between about 1 and 1.5 inches. The dielectric tube 306 may be constructed of any suitable dielectric material, for example, a high-K dielectric material, such as silicon nitride ($Si_3N_4$), aluminum oxide ($Al_2O_3$), PEEK, or the like. Alternatively, in some embodiments, the dielectric tube may comprise a low-K dielectric material, such as PTFE, polystyrene, or the like.

One or more (two shown) guide pins, or shafts 302, may couple the dielectric tube 306 to an actuator 304 for controlling the position of the dielectric tube 306. To allow for the dielectric tube 306 to move freely between the inner and outer conductors 208, 220, the dielectric tube 306 generally has an outer diameter smaller than that the inner diameter of the outer conductor 220, and an inner diameter that is larger than an outer diameter of the inner conductor 208. relative to the inner conductor 208 and outer conductor 220

The actuator 304 may be any suitable actuator capable of accurately controlling the position of the dielectric tube, such as any of the actuators discusses above with respect to the tuning capacitor. In some embodiments, the actuator 304 may be an electric rotary actuator, such as servo motor or a stepper motor.

Figure 4:
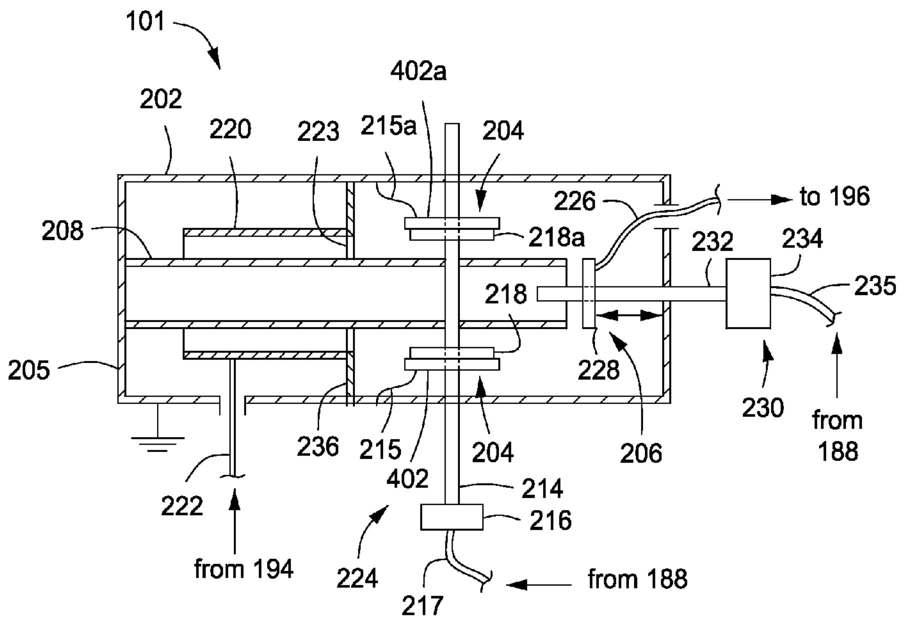

In some embodiments, such as depicted in FIGS. 4 and 4A, the tuning capacitor 204 may include support blocks 402, 402A respectively coupled to the outer facing surfaces of the adjustable electrodes 218, 218A. The support blocks 402, 402A may comprise any suitable rigid material, such as a polymer, capable of providing adequate support to the adjustable tuning electrodes 218. Non-limiting examples of suitable materials for the support blocks 402, 402A include polystyrene (PS), polyvinyl chloride (PVC), polypropylene (PP), polyethylene (PE), polyoxymethylene (POM), or the like.

In some embodiments, the position control mechanism 224 may comprise a single shaft 214, disposed through a through hole provided in the inner conductor 208, and coupled to both adjustable electrodes 218, 218A to simultaneously control the distance of both adjustable electrodes 218, 218A with respect to the inner conductor 208. In such embodiments, the shaft 214 may be threaded with opposing threads at the respective portions of the shaft 214 where the adjustable electrodes 218, 218A are positioned. The adjustable electrodes 218, 218A and the support blocks 402, 402A may comprise a mating threaded hole to interface with the threads of the shaft 214. One end of the shaft 214 is coupled to the actuator 216, for example, a stepper motor, servo motor, or the like, to control a rotation of the shaft 214. In operation, the actuator rotates the threaded shaft 214, causing the adjustable tuning electrodes 218, 218A to move simultaneously closer to or further away from the inner conductor 208.

Returning to FIG. 2, in some embodiments, the load capacitor 206 may be formed by the inner conductor 208, an adjustable load electrode 228, and an intervening dielectric material. A conductor 226 is coupled to the adjustable load electrode 228 and facilitates the coupling of energy from the tunable impedance matching network 101 to an output 196. The conductor 226 may be fabricated from any suitable flexible conductive material. In some embodiments, the conductor 226 comprises a flexible metal braided wire.

The adjustable load electrode 228 may be formed from a suitable conductive material, such as a metal, for example, copper (Cu), beryllium (Be), or combinations thereof. In some embodiments, such as shown in FIG. 2, the intervening dielectric may be air. Alternatively or in combination, in some embodiments, the intervening dielectric may be a dielectric material disposed on one or more of an outer surface of the inner conductor 208 or a facing surface of the adjustable load electrode 228. The dielectric material may comprise any suitable, process compatible dielectric material, including polymers, or fluoropolymers, such as non-limiting examples of PTFE, polystyrene, or the like or the like.

A distance between the adjustable load electrode 228 and the inner conductor 208 may be controlled by a position control mechanism 230, thereby controlling the dielectric constant of the space between the load capacitor electrodes, and thereby controlling the output capacitance of the tunable impedance matching network 101. The position control mechanism 230 may comprise an actuator 234 for controlling the position of the adjustable load electrode 228. In some embodiments, a shaft 232 may be provided to couple the adjustable load electrode 228 to the actuator 234. The actuator 234 may be controlled manually, or via a signal from a controller (such as the controller 188 described with respect to FIG. 1) coupled to the actuator 234 via a line 235. The shaft 232 may be formed from any suitable rigid material, such as a metal, a polymer, or the like. The actuator 234 may be any suitable actuator capable of accurately controlling the position of the adjustable load electrode 228, such as any of the actuators discussed above with respect to the tuning capacitor.

In some embodiments, such as depicted in FIGS. 4 and 5, the distance between the inner conductor 208 and the load electrode 228 may be controlled by a rotational actuator 234 coupled to a threaded shaft 232. In such embodiments, the load electrode 206 comprises a threaded through hole disposed near the center of the load electrode 206, configured to interface with the threads of the shaft 232. In operation, the rotational actuator 234 rotates the shaft 214, thereby moving the load electrode 106 closer or further to the inner conductor 208.

FIG. 5 depicts a detailed view of the load capacitor 206 in accordance with some embodiments of the present invention. The load capacitor 206 generally comprises the inner conductor 208 the adjustable load electrode 228, and an intervening dielectric. In some embodiments, the adjustable load electrode 228 may comprise a conductive ring, such as a copper ring, disposed about a dielectric saddle 510 that is linearly movably disposed over the end of the inner conductor 208. The conductive ring may any suitable conductive material, for example a metal. In some non-limiting embodiments, the conductive ring may comprise copper (Cu), or alloys thereof, such as copper (Cu)-beryllium (Be) alloys, or the like. A threaded shaft 232 coupled to the position control mechanism 130 may be provided to control the movement of the dielectric saddle 510 (and adjustable load electrode 228). For example, the threaded shaft 232 may be disposed through the dielectric saddle 510 and, optionally, a support block 516, via threaded through holes disposed in the dielectric saddle 510 and, if present, support block 516 such that rotation of the shaft 232 controls the linear movement of the dielectric saddle 510 and adjustable load electrode 228. A pin 514 may be provided through the dielectric saddle 510 and the inner conductor 208 to prevent rotation therebetween. A slot 504 may be provided along a longitudinal axis of the dielectric saddle 510 and may contain the pin 514 such that the dielectric saddle 510 may move linearly along a longitudinal axis with respect to the inner conductor 208. The amount of overlap between the adjustable electrode 228 and the inner conductor 208 can thus be controlled by the position control mechanism 130. The amount of overlap between the adjustable electrode 228 and the inner conductor 208 controls the effective surface area of the electrodes of the load capacitor 206, and thus the capacitance.

In some embodiments, an insulator sleeve 502 formed from a dielectric material may be disposed on the outer surface of the inner conductor 208. The dielectric saddle 510 and the insulator sleeve 502 may be fabricated from the same or different dielectric materials. For example, the dielectric saddle 510 and/or the insulator sleeve 502 may comprise a polymer, or a fluoropolymer, such as polytetrafluoroethylene (PTFE), polystyrene, or the like. As shown in FIG. 5A, in some embodiments, the inner conductor 108 and insulator sleeve 502 may have rounded corners to avoid arcing of electrical energy between the inner conductor 208 and other conductive components positioned near the end of the inner conductor 208.

Figure 6A:
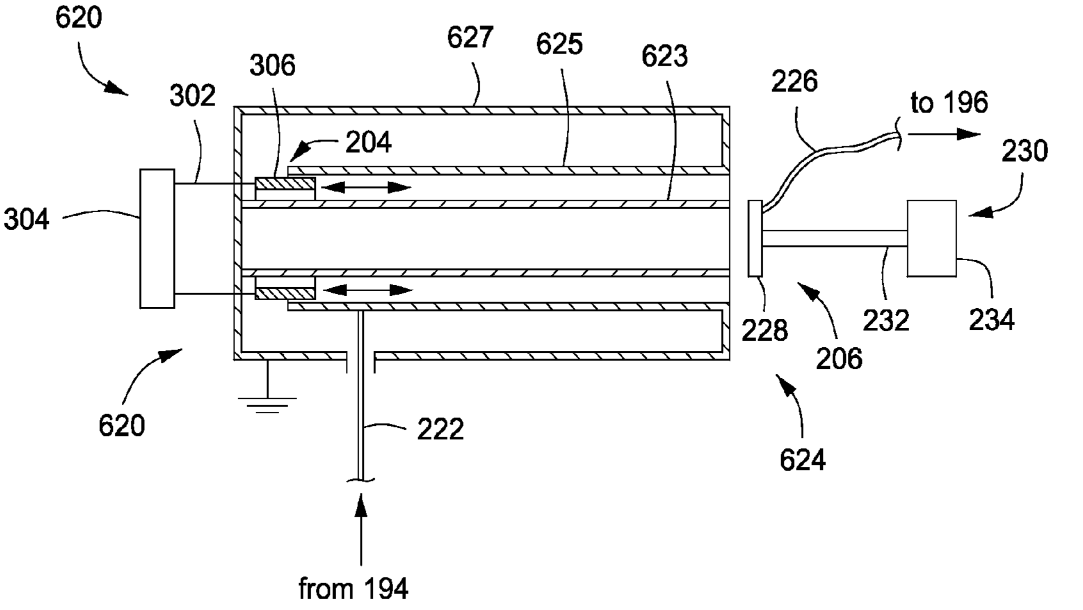
FIGS. 6A-6C depict various configurations of a coaxial resonator suitable for use with some embodiments of the present invention.
Figure 6B:
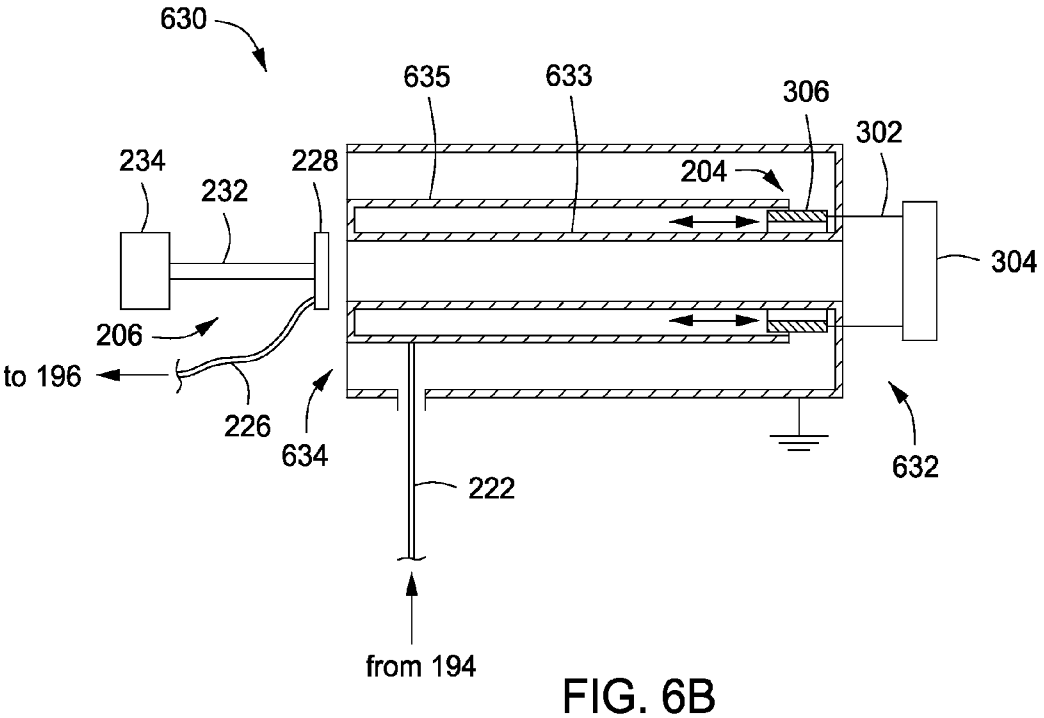
Figure 6C:
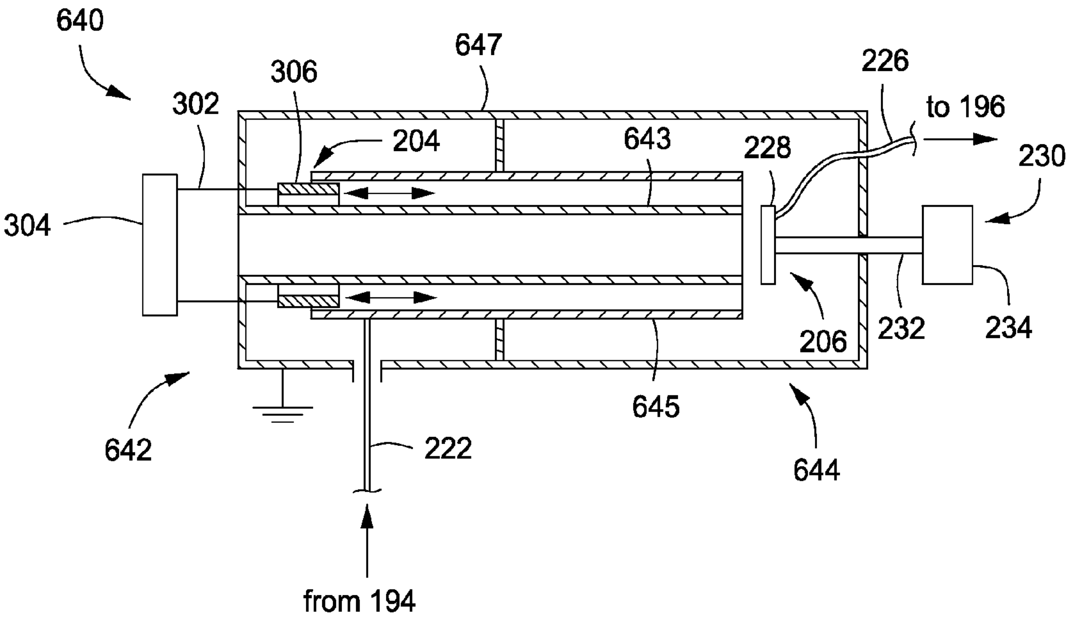

FIGS. 6A-6C depict various configurations of a coaxial resonator suitable for use with some embodiments of the present invention. A detailed description of the various configurations of the coaxial resonator is provided previously incorporated U.S. provisional patent application Ser. No. 61/032,793, filed Feb. 29, 2008.

FIG. 6A depicts an exemplary folded coaxial resonator 620 suitable for use with some embodiments of the present invention. The folded coaxial resonator 620 generally comprises an inner conductor 623, a middle conductor 625, and an outer conductor 627. A conductor 222 is coupled to the middle conductor 625 and is configured to receive power from an input 194. The folded coaxial resonator 620 is terminated at opposing ends by short circuit end 632 and open circuit end 624, which respectively serve as current and voltage node boundaries.

The length of the folded coaxial resonator 610 may be varied with respect to the operational frequency of the accompanying system to achieve resonance therewith. For example, as discussed above, in some embodiments where the operational frequency of the system is 162 MHz, the axial length of the folded coaxial resonator 620 may be half the length (L/2) of the unfolded coaxial resonator 620, or about 0.92 m when calculated as a function of a full wavelength.

Disposed proximate the open circuit end 624 of the folded coaxial resonator 620 is a load capacitor 206, formed by the inner conductor 623, adjustable load electrode 228 and an intervening dielectric. A tuning capacitor 204, comprising a dielectric tube 306, coupled to one or more (two shown) shafts 302, positioned between the inner conductor 623 and middle conductor 625, and an actuator 304 for controlling the linear movement of the dielectric tube 306 relative to the inner conductor 623 and middle conductor 625. Both the load capacitor 206 and tuning capacitor 204 are fully described above with respect to FIGS. 1-5.

FIG. 6B depicts another example of a folded coaxial resonator 630 suitable for use with some embodiments of the present invention. Folded coaxial resonator 630 comprises similar physical dimensions as the folded coaxial resonator 620, described above with respect to FIG. 6B. By contrast, however, resonator structure 630 has an inner conductor 633 and middle conductor 635 that are shorted at the open circuit end 634. As with coaxial resonator 620 of FIG. 6A, a short circuit 632 is disposed at the opposing end of the folded coaxial resonator 630. Similar to folded coaxial resonator 620 described in FIG. 6B, disposed proximate the open circuit end 634 is a load capacitor 206, formed by the inner conductor 633, adjustable load electrode 228 and intervening dielectric (not shown). In addition, also similar to folded coaxial resonator 620 described in FIG. 6B, a tuning capacitor 306, comprising a dielectric tube 306, coupled to one or more (two shown) shafts 302, is positioned between the inner conductor 633 and middle conductor 635, and moved linearly via an actuator 304.

FIG. 6C depicts yet another example of a folded coaxial resonator 640 for use with some embodiments of the present invention. Resonator structure 640 illustrates particular tradeoffs that may be made between the electrical and physical lengths of a folded coaxial resonator structure according to some embodiments. Specifically, coaxial resonator structure 640 includes an outer conductor section 647 of first physical length, and an inner conductor section 643 and middle conductor section 645 both of a second physical length. Similar to the above embodiments described in FIGS. 6B-C, folded coaxial resonator 640 comprises a closed circuit end 642 and an open circuit end 644, a load capacitor 206 are disposed proximate the open circuit end 644, and a tuning capacitor 204.

While FIGS. 6A-C depict various exemplary embodiments of configurations of a coaxial resonator suitable for use with some embodiments of the present invention, it is contemplated that pluralities of embodiments are achievable by appropriately configuring the dimensions (i.e. length and diameter) to suit any specific application.

Returning to FIG. 1, a controller 188 may coupled to the tunable impedance matching network 101 for controlling the operation thereof. The controller 188 may be the controller for operating the system 100, or portions thereof, or it may be a separate controller. The controller 188 generally comprises a central processing unit (CPU) 191, a memory 190, and support circuits 189 for the CPU 191. The controller 188 may control the tunable impedance matching network 101 directly (e.g. via a digital controller card), or via computers (or controllers) associated with particular process chamber and/or the support system components. The controller 188 may be one of any form of general-purpose computer processor that can be used in an industrial setting for controlling various chambers and sub-processors. The memory, or computer-readable medium, 190 of the CPU 191 may be one or more of readily available memory such as random access memory (RAM), read only memory (ROM), floppy disk, hard disk, flash, or any other form of digital storage, local or remote. The support circuits 189 are coupled to the CPU 191 for supporting the processor in a conventional manner. These circuits may include cache, power supplies, clock circuits, input/output circuitry and subsystems, and the like.

A phase and magnitude detector 192, or independent phase and magnitude detectors, may be provided to detect the phase and magnitude of RF power reflected from the overhead electrode 125. The phase and magnitude detector 192 is coupled to the controller 188 and provides signals representative of the phase (polarity) and the magnitude of the reflected RF power. Alternatively, in some embodiments, other detectors, such as directional couplers (not shown) or the like, may be used in place of the phase and magnitude detectors. In operation, the phase and magnitude detector 192 determines the phase and the magnitude of reflected RF power and provides corresponding signals to the controller 188. The controller 188 may control the operation of the tunable impedance matching network 101 in response to such signals to minimize the RF power that is reflected from the overhead electrode 125 during operation. For example, the phase signal may be utilized to control the position of the tuning capacitor (for example, using a stepper motor as discussed above) and the magnitude signal may be utilized to control the load capacitor (for example, using a stepper motor as discussed above).

Alternatively, in some embodiments, a software based conjugate gradient search method may be used, whereby each tunable element of the tunable impedance matching network 101 is adjusted in sequence. At every adjustment, the reflected power is determined by the phase and magnitude detector 192 and, based on whether the reflected power increases or decreases, the next tunable element of the tunable impedance matching network 101 is adjusted.

While the foregoing is directed to embodiments of the present invention, other and further embodiments of the invention may be devised without departing from the basic scope thereof.

The invention claimed is:

1. An impedance matching network, comprising:

a coaxial resonator having an inner conductor, a middle conductor, an outer conductor, and a dielectric tube disposed between the inner conductor and the middle conductor, wherein the outer conductor is folded to form at least one of the inner conductor or the middle conductor, and wherein the middle conductor is coupled to an input to receive power and substantially coaxially surrounds at least a portion of the inner conductor;

a tuning capacitor for variably controlling a resonance frequency of the coaxial resonator formed by the inner conductor, the middle conductor and the dielectric tube; and a load capacitor for variably coupling energy from the inner conductor to a load, the load capacitor formed by the inner conductor, an adjustable load electrode, and an intervening dielectric.

2. The impedance matching network of claim 1, wherein the load capacitor comprises an output configured to be connected to a load.

3. The impedance matching network of claim 1, wherein the inner conductor, the middle conductor, and the outer conductor are fabricated from aluminum (Al).

4. The impedance matching network of claim 1, wherein the inner conductor further comprises a dielectric material disposed on an outer surface thereof.

5. The impedance matching network of claim 4, wherein the dielectric material comprises one of polytetrafluoroethylene (PTFE) or polystyrene.

6. The impedance matching network of claim 1, wherein the load capacitor further comprises:

a dielectric saddle disposed over an end of the inner conductor and movable along a longitudinal axis with respect to the inner conductor; and wherein the adjustable load electrode comprises a conductive ring disposed about an outer surface of the dielectric saddle.

7. The impedance matching network of claim 6, wherein the dielectric saddle comprises one of polytetrafluoroethylene (PTFE) or polystyrene.

8. The impedance matching network of claim 6, wherein the conductive ring further comprises at least one of copper (Cu) or beryllium (Be).

9. The impedance matching network of claim 6, wherein the load capacitor further comprises a position control mechanism for controlling an overlap between the conductive ring and the end of the inner conductor.

10. The impedance matching network of claim 9, wherein the position control mechanism further comprises:

a threaded shaft interfacing with the dielectric saddle for controlling the position thereof via rotation of the threaded shaft; and an actuator connected to the threaded shaft to control the rotation thereof.

11. The impedance matching network of claim 10, wherein the actuator comprises a servo motor or a stepper motor.

12. The impedance matching network of claim 6, wherein the inner conductor further comprises a rounded end.

13. The impedance matching network of claim 1, wherein the load capacitor further comprises a position control mechanism for controlling a distance defined between the adjustable load electrode and the inner conductor.

14. The impedance matching network of claim 1, wherein the dielectric tube is movably disposed between the inner conductor and the middle conductor and having a controllable overlap therewith, the amount of overlap defining a total dielectric value of the dielectric tube.

15. The impedance matching network of claim 14, further comprising:

a position control mechanism coupled to the dielectric tube for adjusting the position of the dielectric tube with respect to the inner conductor and the middle conductor.

16. The impedance matching network of claim 1, further comprising:

a conductive plate disposed within the outer conductor, the conductive plate having a through hole formed proximate a center of the conductive plate, wherein the middle conductor is coupled to the conductive plate and disposed within the through hole, and wherein the inner conductor is disposed within the through hole without making contact with the conductive plate.

17. The impedance matching network of claim 1, wherein the coaxial resonator is terminated at opposing ends by a short circuit end and an open circuit end, and wherein the load capacitor is disposed proximate the open circuit end.

18. The impedance matching network of claim 17, wherein the inner conductor and middle conductor are shorted at the open circuit end.

19. A substrate processing system, comprising:

a process chamber having a substrate support disposed therein;

one or more electrodes for coupling RF power into the process chamber; and one or more RF power sources coupled to the one or more electrodes through the impedance matching network of claim 1.

20. The substrate processing system of claim 19, further comprising:

one or more detectors to sense a magnitude and polarity of RF power reflected from a load during operation of the substrate processing system; and a controller to vary the tuning capacitor in response to a signal corresponding to the sensed phase of the reflected RF power and to vary the load capacitor in response to a signal corresponding to the sensed magnitude of the reflected RF power.

21. An impedance matching network, comprising:

a coaxial resonator having a folded structure providing a more compact physical length as compared to its electrical length, the coaxial resonator comprising:

an outer conductor folded to form an inner conductor and a middle conductor, wherein the middle conductor is coupled to an input to receive power and substantially coaxially surrounds at least a portion of the inner conductor;

a tuning capacitor for variably controlling a resonance frequency of the coaxial resonator formed by the inner conductor, the middle conductor and a dielectric tube movably disposed between the inner conductor and the middle conductor; and a load capacitor for variably coupling energy from the inner conductor to a load, the load capacitor formed by the inner conductor, an adjustable load electrode, and an intervening dielectric.

22. The impedance matching network of claim 21, wherein the tuning capacitor comprises a position control mechanism coupled to the dielectric tube for adjusting the position of the dielectric tube with respect to the inner conductor and the middle conductor, and wherein the load capacitor comprises a position control mechanism for controlling a distance defined between the adjustable load electrode and the inner conductor.

23. A substrate processing system, comprising:

a process chamber having a substrate support disposed therein;

one or more electrodes for coupling RF power into the process chamber;

one or more RF power sources coupled to the one or more electrodes through the impedance matching network of claim 21;

one or more detectors to sense a magnitude and polarity of RF power reflected from a load during operation of the substrate processing system; and a controller to vary the tuning capacitor in response to a signal corresponding to the sensed phase of the reflected RF power and to vary the load capacitor in response to a signal corresponding to the sensed magnitude of the reflected RF power.

24. An impedance matching network, comprising:

a coaxial resonator having a folded structure providing a more compact physical length as compared to its electrical length, the coaxial resonator comprising:

an inner conductor;

an outer conductor folded to form a middle conductor, wherein the middle conductor is coupled to an input to receive power and substantially coaxially surrounds at least a portion of the inner conductor;

a tuning capacitor for variably controlling a resonance frequency of the coaxial resonator formed by the inner conductor, the middle conductor and a dielectric tube movably disposed between the inner conductor and the middle conductor; and a load capacitor for variably coupling energy from the inner conductor to a load, the load capacitor formed by the inner conductor, an adjustable load electrode, and an intervening dielectric.

25. The impedance matching network of claim 24, wherein the tuning capacitor comprises a position control mechanism coupled to the dielectric tube for adjusting the position of the dielectric tube with respect to the inner conductor and the middle conductor, and wherein the load capacitor comprises a position control mechanism for controlling a distance defined between the adjustable load electrode and the inner conductor.

26. A substrate processing system, comprising:

a process chamber having a substrate support disposed therein;

one or more electrodes for coupling RF power into the process chamber;

one or more RF power sources coupled to the one or more electrodes through the impedance matching network of claim 24;

one or more detectors to sense a magnitude and polarity of RF power reflected from a load during operation of the substrate processing system; and a controller to vary the tuning capacitor in response to a signal corresponding to the sensed phase of the reflected RF power and to vary the load capacitor in response to a signal corresponding to the sensed magnitude of the reflected RF power.

* * * * *